United States Patent [19]
Park et al.

[11] Patent Number: 6,063,735
[45] Date of Patent: May 16, 2000

[54] SUPERCONDUCTOR MIXTURE

[75] Inventors: Jai Won Park, Goettingen; Karl Koehler, Diekholzen; Ferdinand Hardinghaus, Bad Hoenningen; Paul Jaeger, Hannover; Klaus Fischer, Jena-Cospeda; Tobias Habisreuther; Wolfgang Gawalek, both of Jena; Doris Litzkendorf, Jena-Cospeda; Peter Goernert; Minzi Wu, both of Jena, all of Germany

[73] Assignees: Solvay Barium Strontium GmbH, Hannover; Institut fuer Physikalische Hochtechnologie e.V., Jena, both of Germany

[21] Appl. No.: 09/000,460
[22] PCT Filed: Jul. 26, 1996
[86] PCT No.: PCT/EP96/03312
  § 371 Date: Jun. 3, 1998
  § 102(e) Date: Jun. 3, 1998
[87] PCT Pub. No.: WO97/06567
  PCT Pub. Date: Feb. 20, 1997

[30] Foreign Application Priority Data

Aug. 4, 1995 [DE] Germany ............ 195 28 799
Feb. 2, 1996 [DE] Germany ............ 196 03 820

[51] Int. Cl.[7] .................. C04B 35/505; C04B 35/64
[52] U.S. Cl. .................. 505/125; 505/126; 505/500; 505/742; 505/785
[58] Field of Search .................. 505/126, 490, 505/491, 500, 739, 742, 785

[56] References Cited

U.S. PATENT DOCUMENTS 5,413,981  5/1995  Egawa et al. .............. 505/121

FOREIGN PATENT DOCUMENTS 284438   9/1988   European Pat. Off. .
575968  12/1993   European Pat. Off. .
WO 90/04568 5/1990 WIPO .

OTHER PUBLICATIONS

Aldrich Chemicals → Products for Superconductivity Research, p. 17, 1991.

Stecura, "Superconducting $YBa_2Cu_3O_7$ Powder . . . " J. Mater. Bynth. Process, 2(3) pp. 169–177 (Abstract Only), 1994.

Osamura et al "Improvement of Critical Current Density in $YBa_2Cu_3O_7$ . . . " JJAP, vol. 29, No. 9, Sep. 1990 pp. L 1621–1623.

Todt et al., "Melt–processing of $YBa_2CU_3O_x$ and $Bi_2Sr_2CaCu_2O_y$: Influence of Processing Parameters on Microstructure and Magnetization Behavior", *IEEE Transactions on Applied Superconductivity*, vol. 5, No. 2, Jun. 1995, pp. 1623–1626.

Baliga et al., "Enhanced Grain Growth in $Yba_2Cu_3O_7$ Doped with Ag, Cu, and CuO", *Applied Physics A: Solids and Surfaces*, A49 (Aug. 1989), No. 2, pp. 139–140.

*Primary Examiner*—Mark Kopec
*Attorney, Agent, or Firm*—Evenson, McKeown, Edwards & Lenahan, P.L.L.C.

[57] ABSTRACT

A mixture suitable for the production of melt-processed high-temperature superconductors capable of producing a high levitation force. The mixture contains $YBa_2Cu_3O_{7-x}$ powder with a very low content of copper oxide, i.e. copper not bound in with the $YBa_2Cu_3O_{7-x}$, and a very low carbon content. Also included are stabilizing (so-called "flux-pinning") additives. Also disclosed is a method or producing the mixture, as well as $YBa_2Cu_3O_{7-x}$ powder with suitable low free copper oxide and carbon contents, used to prepare the mixture.

19 Claims, No Drawings

SUPERCONDUCTOR MIXTURE

BACKGROUND OF THE INVENTION

The invention relates to a superconductor premixture prepared for fusion processing, a method for the production thereof, and a $YBa_2Cu_3O_{7-x}$ powder which can be used in preparing the premixture.

$YBa_2Cu_3O_{7-x}$ powder (x=0 to 0.5) is used for the preparation of technical superconductors. The powder is advantageously mixed with stabilizing additives which form sticking or pinning centers. The resulting premixture is pressed into compacts and heat treated, preferably by fusion processing. In fusion processing the surfaces of the powder particles of the premixture are heat-softened, so that in the cooling that follows the particles are bonded tightly to one another. The flow of the electric current through the grain boundaries is thus improved. The stabilizing additives usually have the effect of reducing the melting temperature of the premixture, so that the softening of the bodies that are to formed and the escape of molten material otherwise observed at higher fusion texturizing temperatures, can be prevented. The additives, which form sticking or pinning centers, permit increasing the critical current density in the superconductors. The pinning centers provide for an anchoring of the magnetic lines of flux, so that high critical currents can also be achieved in the magnetic field. Flux pinning additives for superconductors composes of copper oxide are disclosed, for example, in European Patent Applications EP-A-0 292 126 and 296 380.

The bodies obtained by fusion processing from high-temperature superconductor material can be used, for example, in the manufacture of electric motors and in the production of the so-called "flywheel." The flywheel rotates under superconducting conditions in the magnetic field and serves to store kinetic energy.

SUMMARY OF THE INVENTION

It is the object of the present invention to provide an improved premixture composed of $YBa_2Cu_3O_{7-x}$ powders with stabilizing additives or those producing flux pinning. This object is achieved by the premixture described below.

The invention is based on the knowledge that premixtures which comprise the $YBa_2Cu_3O_{7-x}$ powders and stabilizing or flux pinning additives are especially well suited for the preparation of fusion-processed bodies if they have a small content of carbon combined with a small content of free copper oxide not bound in the $YBa_2Cu_3O_{7-x}$ phase.

The superconductor premixture according to the invention, which is designed for fusion processing, comprises additives which produce flux pinning as well as $YBa_2Cu_3O_{7-x}$ powder, this $YBa_2Cu_3O_{7-x}$ powder containing less than 0.6 wt.-% of free copper oxide not bound in the $YBa_2Cu_3O_{7-x}$ phase and less than 0.1 wt.-% carbon, relative to the $YBa_2Cu_3O_{7-x}$ powder.

The stabilizing or flux pinning additives can basically be added in any amount in which they result in the desired effect. The stabilizing action lies, for example, in the fact that the melting temperature of the particles in the superconductor premixture is lowered. The additives that produce the flux pinning cause the magnetic flux lines to be anchored in the superconducting material, and consequently high critical currents become possible. Any customary stabilizing or flux pinning additives can be used. There are additives, such as $Y_2BaCuO_5$, of which it is assumed that they have both a stabilizing and a flux pinning action. Especially well suited as additives are $Y_2O_3$, $Y_2BaCuO_5$, $PtO_2$, $Ag_2O$, $CeO_2$, $SnO_2$, $ZrO_2$, $BaCeO_3$ and $BaTiO_3$.

Preferred superconductor premixtures according to the invention contain 0.1 to 50 wt.-% of stabilizing additives or additives that produce flux pinning, relative to the $YBa_2Cu_3O_{7-x}$ powder taken as 100%.

A content of $Y_2O_3$, $Y_2BaCuO_5$, $PtO_2$, $Ag_2O$, $CeO_2$, $SnO_2$, $ZrO_2$, $BaCeO_3$ and/or $BaTiO_3$ is preferred as stabilizing or flux pinning additives in the superconductor premixture according to the invention.

If $Y_2O_3$ is contained, an addition of 0.1 to 50 wt.-% of this compound, with respect to the $YBa_2Cu_3O_{7-x}$ powder taken as 100 wt.-%, is very advantageous; if $Y_2BaCuO_5$ is contained, 0.1 to 50 wt.-% is advantageous. If $PtO_2$ is contained, 0.5 to 5 wt.-% of $PtO_2$ additive is advantageous. If $Ag_2O$ is contained, and an addition of 1 to 20 wt.-% is advantageous. If $CeO_2$, $SnO_2$, $ZrO_2$, $BaCeO_3$ and/or $BaTiO_3$ is contained, a content of 0.1 to 5 wt.-% is preferred.

A superconductor premixture of the invention with especially advantageous properties in fusion texturizing contains less than 0.05 wt.-% of carbon, relative to the $YBa_2Cu_3O_{7-x}$ phase. Free copper oxide not bound in the $YBa_2Cu_3O_{7-x}$ phase is preferably contained in an amount of less than 0.2 wt.-%.

It has proven to be advantageous if the superconductor premixture comprises particles in the grain size range from above 30 up to 500 μm. It is especially advantageous if 40 to 70 wt.-% of the amount is in the stated grain size range.

If desired, the superconductor premixture according to the invention can be in compressed form, for example in the form of compacts pressed axially or isostatically.

DETAILED DESCRIPTION OF PREFERRED EMBODIMENTS

The preparation of the superconductor premixture of the invention will be described below. For this purpose a $YBa_2Cu_3O_{7-x}$ powder containing less than 0.6 wt.-% of free copper oxide not bound in the $YBa_2Cu_3O_{7-x}$ phase, relative to the $YBa_2Cu_3O_{7-x}$ powder, and less than 0.1 wt.-% of carbon relative to the $YBa_2Cu_3O_{7-x}$ powder, is mixed according to the invention with stabilizing and/or flux pinning additives. The mixture, i.e., the premixture, can then be pressed if desired, axially or isostatically for example, to form compacts. Powder with preferred properties, the especially good stabilizing and/or flux pinning additives, and their preferred amounts, have already been mentioned above.

The preparation of a $YBa_2Cu_3O_{7-x}$ powder is explained hereinafter, which has the specification required for use in the superconductor premixture of the invention with regard to the free copper oxide content and the carbon content. This powder, which is especially suitable for use in the superconducting premixture of the invention is likewise subject matter of the invention.

This $YBa_2Cu_3O_{7-x}$ powder according to the invention, usable to special advantage in the superconductor premixture, is prepared by mixing together powdered yttrium, barium and copper compounds which include anions which have oxygen as well as, in some cases, hydrogen and/or carbon, and which are used in such amounts that the atomic ratio of yttrium, barium and copper is substantially 1:2:3, a) calcining the finely divided starting material by heating it to a temperature of 850 to 920° C. in an oxygen-containing atmosphere, holding it at this temperature, then cooling it to room temperature, and then finely dividing the partially sintered powder body, b) repeating step a) one or more times, and after the last repetition, upon cooling in the temperature range of 380 to 420° C., inserting a holding phase of up to 50 hours, until the mixture obtained is fully oxidized, and in the obtained mixture the detectable residue of copper oxide not bound in the $YBa_2Cu_3O_{7-x}$ phase is less than 0.6 wt.-% and carbon less than 0.1 wt.-% with respect to the $YBa_2Cu_3O_{7-x}$ powder, and c) comminuting the material obtained in step b).

It is advantageous to use a powder in which at least 40% of the material is in the grain size range of 30 to 500 μm. It is especially preferred to prepare the superconductor premixture of the invention by admixing a $YBa_2Cu_3O_{7-x}$ powder in which 40 to 70 wt.-% of the material is in the grain size range of 30 to 500 μm. If the powder is produced by the method described above, it is preferred to grind, and optionally sort, the material after the holding phase.

The $YBa_2Cu_3O_{7-x}$ powder of the invention is advantageously prepared by using $Y_2O_3$, CuO and barium hydroxide, hydrated barium hydroxide or barium carbonate.

The calcination in the above-described step a) can advantageously be performed by calcining the starting material in loose or precompressed form by initially heating it in air at a rate of 100 to 400° C./hour from ambient temperature to an end temperature of 850 to 920° C., letting it stand at this temperature for 100 to 400 hours and then cooling it to ambient temperature at 100 to 200° C. per hour. The resulting material can then be ground as mentioned above, if desired, and sorted, if desired. At the end of the holding phase, the $YBa_2Cu_3O_{7-x}$ powder is advantageously mixed with the additive or additives and, if desired, axially or isostatically pressed to form compacts.

The superconductor premixture according to the invention is outstandingly suitable for the preparation of fusion-processed high-temperature superconductors with high levitation power. The compacts which are made with the premixture according to the invention are very stable; in tests of large numbers of samples they exhibit reproducible high levitation forces.

The following example is intended to further explain the invention without limiting its scope.

EXAMPLE a) Preparation of the $YBa_2Cu_3O_{7-x}$ powder.

The yttrium compound used was commercial $Y_2O_3$ with a purity of 99.99%, the copper compound was commercial CuO with a purity of 99.999% and the barium compound commercial $BaCO_3$ with a purity of 99.4%. The starting materials were measured out according to the desired composition for producing an amount of 500 g, and were homogeneously mixed. The mixture was loosely filled into in Kawenite crucibles (diameter 50 mm, height 35 mm). The crucibles were placed in a laboratory muffle kiln with low temperature gradients (ΔT<1 K/cm) and heated at 300 K/hour to an end temperature of 905° C. The powder was held at this temperature for 96 hours and thereafter cooled at 200 K/hour to room temperature. The powder cake was crumbled and sieved, and the crucibles were again filled with this granulate. The granulate was subjected to a second heating cycle over 72 hours, to a third heating cycle over 62 hours, and to a fourth heating cycle over 70 hours, at the same temperature and at equal heating and cooling rates, and crumbled and sieved after each heating cycle. After the last cycle the granulate was held at 400° C. for one hour, cooled at 200 K/hour to room temperature, and comminuted. All of the heating cycles were performed in air. The detectable free copper oxide in the fully reacted powder was measured by differential thermal analysis and thermogravimetry, and is under 0.2 wt.-%. The carbon content according to chemical analysis is less than 0.05 wt.-%. The extensive conversion of the premixture to the orthorhombic phase was detectable by means of the doublet cleavage in the X-ray diffraction spectrum.

b) Verification of the Premixture.

The powder was premixed with 9 wt.-% of yttrium oxide and 1 wt.-% of platinum oxide. The premixture was pressed axially at 3 MPa to compacts 35 mm in diameter and 20 mm in height. The compacts were heated at 300 K/hour to 1190° C. and held for 0.5 hours, then cooled at 400 K/hour to 980° C., and slowly fusion-processed from this temperature at 1 K/hour to 950° C. in the temperature gradient of 5 K/cm. Cooling to room temperature was performed at 400 K/h. In a separate heat process between 400 to 600° C. over 144 hours the material was converted to the orthorhombic phase. In the superconductive state at 77 Kelvin, when the compact approaches a samarium-cobalt permanent magnet 25 mm in diameter and 10 mm in thickness, at a distance of 0.5 mm levitation forces of 40 to 60 N are produced, corresponding to 30 to 35% of the repulsive forces, for perfect shielding.

What is claimed is:

1. Powdered $YBa_2Cu_3O_{7-x}$ containing greater than zero percent to less than 0.6 wt.-% of free copper oxide not bound in the $YBa_2Cu_3O_{7-x}$ phase and less than 0.1 wt.-% of carbon, said wt.-% values being calculated relative to the weight of $YBa_2Cu_3O_{7-x}$.

2. A superconductor premixture prepared for fusion processing, comprising $YBa_2Cu_3O_{7-x}$ powder and at least one stabilizing additive or flux pinning additive, wherein said $YBa_2Cu_3O_{7-x}$ powder contains greater than zero percent to less than 0.6 wt.-% of free copper oxide not bound in the $YBa_2Cu_3O_{7-x}$ phase and less than 0.1 wt.-% of carbon, relative to the weight of the $YBa_2Cu_3O_{7-x}$ powder.

3. A superconductor premixture according to claim 2, wherein said premixture comprises from 0.1 to 50 wt.-% of said stabilizing additive or flux pinning additive, relative to the weight of the $YBa_2Cu_3O_{7-x}$ powder.

4. A superconductor premixture according to claim 2, wherein said $YBa_2Cu_3O_{7-x}$ powder contains greater than zero to less than 0.2 wt.-% of free copper oxide not bound in the $YBa_2Cu_3O_{7-x}$ phase.

5. A superconductor premixture according to claim 2, wherein said $YBa_2Cu_3O_{7-x}$ powder contains less than 0.05 wt.-% of carbon with respect to the $YBa_2Cu_3O_{7-x}$ phase.

6. A superconductor premixture according to claim 2, wherein at least 40% of the $YBa_2Cu_3O_{7-x}$ powder is comprised of powder particles having a grain size in the range from 30 to 500 μm.

7. A superconductor premixture according to claim 2, wherein said stabilizing additive or flux pinning additive comprises yttrium oxide, $Y_2O_3$, platinum dioxide, $Ag_2O$, $CeO_2$, $SnO_2$, $BaCeO_3$, $BaTiO_3$ and mixtures of two or more thereof.

8. A superconductor premixture according to claim 7, wherein said stabilizing additive or flux pinning additive comprises at least one substance selected from the group consisting of 0.1 to 50 wt.-% of $Y_2O_3$, 0.1 to 50 wt.-% of $Y_2BaCuO_5$, 0.5 to 5 wt.-% of $PtO_2$, 1 to 20 wt.-% $Ag_2O$ and 0.1 to 5 wt.-% of at least one of $CeO_2$, $SnO_2$, $ZrO_2$, $BaCeO_3$ and $BaTiO_3$, said wt.-% values being calculated relative to the weight of the $YBa_2Cu_3O_{7-x}$.

9. A method of preparing a superconductor premixture for fusion processing, said method comprising admixing $YBa_2Cu_3O_{7-x}$ powder containing greater than zero percent to less than 0.6 wt.-%, relative to the $YBa_2Cu_3O_{7-x}$, of free copper oxide not bound in the $YBa_2Cu_3O_{7-x}$ phase and less than 0.1%, relative to the $YBa_2Cu_3O_{7-x}$, of carbon with at least one stabilizing additive or flux pinning additive.

10. A method according to claim 9, further comprising the step of pressing the mixture axially to a compact.

11. A method according to claim 9, further comprising the step of pressing the mixture isostatically to a compact.

12. A method according to claim 9, further comprising preparing said $YBa_2Cu_3O_{7-x}$ by:

providing a mixture of finely divided yttrium, barium and copper starting compounds which include oxygen-containing anions, said mixture containing said yttrium, barium and copper compounds in amounts such that yttrium, barium and copper are present in the mixture in an atomic ratio of substantially 1:2:3;

calcining the mixture by heating to a temperature of 850 to 920° C. in an oxygen-containing atmosphere, holding the mixture at that temperature, and then cooling the mixture to room temperature, whereby a partially sintered product is produced;

comminuting the partially sintered product;

repeating the foregoing calcining and comminuting steps at least one, and during the cooling of the last repetition, holding in a temperature range of 380 to 420° C. for a holding phase of up to 50 hours until the mixture is completely oxidized and the amount of copper oxide detectable in the mixture, but not bound in the $YBa_2Cu_3O_{7-x}$ phase, is greater than zero percent to below 0.6 wt.-% and the amount of carbon is less than 0.1 wt.-%, said wt.-% values being calculated relative to the weight of $YBa_2Cu_3O_{7-x}$.

13. A method according to claim 12, wherein said anions contain at least one additional element selected from hydrogen and carbon.

14. A method according to claim 12, wherein after the comminution of the last repetition, at least 40 wt.-% of the comminuted material has a grain size in the range of 30 to 500 μm.

15. A method according to claim 12, wherein after the comminution of the last repetition, the comminuted mixture is sorted to collect a product in which at least 40 wt.-% has a grain size in the range of 30 to 500 μ.

16. A method according to claim 12, wherein the comminuted product from the last repetition is admixed with the at least one additive, and further comprising pressing the mixture to a compact.

17. A method according to claim 12, wherein the yttrium starting compound in $Y_2O_3$, the starting copper compound is CuO, and the starting barium compound is selected from barium hydroxide, hydrated barium hydroxide and barium carbonate.

18. A method according to claim 12, wherein the mixture of starting compounds is calcined in loose or slightly compressed form by initially heating it in air at a rate of 100 to 400° C./hour from ambient temperature to an end temperature of 850 to 920° C., holding at this temperature for 100 to 400 hours, and then cooling to ambient temperature at 100 to 200° C. per hour.

19. A method according to claim 12, wherein the product is ground and sorted so that 40 to 70 wt.-% thereof has a grain size in the range of 30 to 500 μm.

* * * * *